US011047877B2

(12) United States Patent
Wolkow et al.

(10) Patent No.: US 11,047,877 B2
(45) Date of Patent: Jun. 29, 2021

(54) INITIATING AND MONITORING THE EVOLUTION OF SINGLE ELECTRONS WITHIN ATOM-DEFINED STRUCTURES

(71) Applicant: Quantum Silicon Inc., Edmonton (CA)

(72) Inventors: Robert Wolkow, Edmonton (CA); Mohammad Rashidi, Edmonton (CA); Wyatt Vine, Edmonton (CA); Thomas Dienel, Edmonton (CA); Lucian Livadaru, Edmonton (CA); Taleana Huff, Edmonton (CA); Jacob Retallick, Edmonton (CA); Konrad Walus, Edmonton (CA)

(73) Assignee: Quantum Silicon Inc., Edmonton (CA)

( * ) Notice: Subject to any disclaimer, the term of this patent is extended or adjusted under 35 U.S.C. 154(b) by 0 days.

(21) Appl. No.: 16/651,480

(22) PCT Filed: Sep. 28, 2018

(86) PCT No.: PCT/CA2018/051224
§ 371 (c)(1),
(2) Date: Mar. 27, 2020

(87) PCT Pub. No.: WO2019/060999
PCT Pub. Date: Apr. 4, 2019

(65) Prior Publication Data
US 2020/0249256 A1 Aug. 6, 2020

Related U.S. Application Data

(60) Provisional application No. 62/564,734, filed on Sep. 28, 2017.

(51) Int. Cl.
*G01Q 80/00* (2010.01)
*G01Q 30/10* (2010.01)
(Continued)

(52) U.S. Cl.
CPC ............. *G01Q 80/00* (2013.01); *G01Q 30/10* (2013.01); *G01Q 60/10* (2013.01); *G01Q 60/24* (2013.01);
(Continued)

(58) Field of Classification Search
CPC ........ G01Q 80/00; G01Q 30/10; G01Q 60/10; G01Q 60/24; G06N 3/04; G06N 3/08
(Continued)

(56) References Cited

U.S. PATENT DOCUMENTS

| 5,844,834 A | * | 12/1998 | Risch | ................... | B82Y 10/00 |
| | | | | | 365/150 |
| 7,463,573 B2 | * | 12/2008 | Fan | ...................... | G11B 5/743 |
| | | | | | 369/126 |

(Continued)

FOREIGN PATENT DOCUMENTS

| WO | 03018465 | 3/2003 |
| WO | 2004019270 | 3/2003 |

OTHER PUBLICATIONS

Int'l. Search Report for PCT/CA2018/051224, dated Dec. 20, 2018.
(Continued)

*Primary Examiner* — Nicole M Ippolito
(74) *Attorney, Agent, or Firm* — Avery N. Goldstein; Blue Filament Law PLLC

(57) ABSTRACT

A method for the patterning and control of single electrons on a surface is provided that includes implementing scanning tunneling microscopy hydrogen lithography with a scanning probe microscope to form charge structures with one or more confined charges; performing a series of field-free atomic force microscopy measurements on the charge structures with different tip heights, where interaction between the tip and the confined charge are elucidated; and adjusting tip heights to controllably position charges within
(Continued)

the structures to write a given charge state. The present disclose also provides a Gibb's distribution machine formed with the method for the patterning and control of single electrons on a surface. A multi bit true random number generator and neural network learning hardware formed with the above described method are also provided.

20 Claims, 8 Drawing Sheets

(51) Int. Cl.
G01Q 60/10 (2010.01)
G01Q 60/24 (2010.01)
G01Q 70/14 (2010.01)
G06N 3/04 (2006.01)
G06N 3/08 (2006.01)

(52) U.S. Cl.
CPC ............ G01Q 70/14 (2013.01); G06N 3/04 (2013.01); G06N 3/08 (2013.01)

(58) Field of Classification Search
USPC .......... 850/5, 22, 23, 52; 250/306, 307, 310, 250/311
See application file for complete search history.

(56) References Cited

U.S. PATENT DOCUMENTS

2004/0023519 A1 2/2004 Clark et al.
2013/0307054 A1* 11/2013 Yasuda ................ H01L 29/792
257/326
2016/0155839 A1* 6/2016 Strachan ............. H01L 29/7881
257/29

OTHER PUBLICATIONS

Wolkow et al., "Silicon Atomic Quantum Dots Enable Beyond-CMOS Electronics". arXiv.org, Dec. 6, 2013 (Dec. 6, 2013),pp. 1-27, [on line] [retrieved on Dec. 11, 2018 (Dec. 11, 2018)]. Retrieved from the Internet: <https:i/arxiv.org/ftp/arxiv/papers/ 1310/ 1310.4 148.pdf> whole document*.

* cited by examiner

SI 2:

Fig. 4c
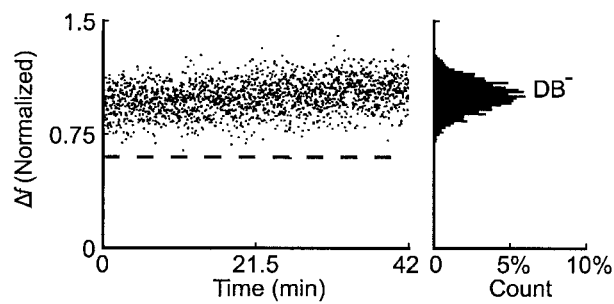
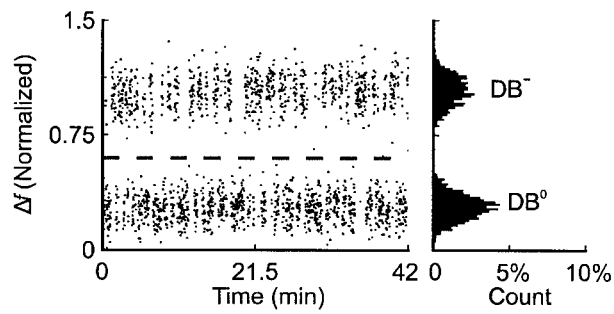
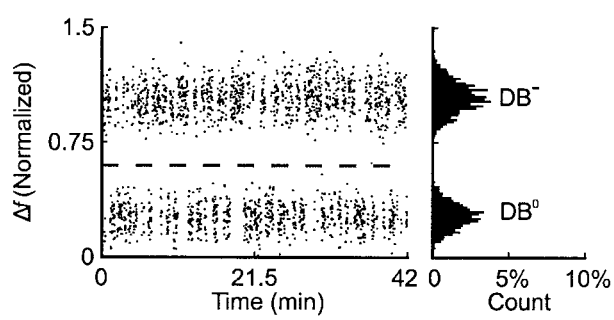
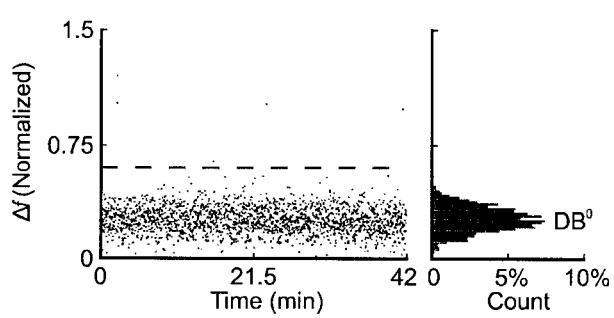
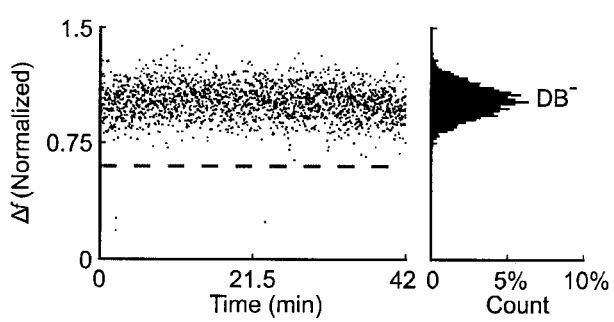
Fig. 4d

SI 3:

SI 4:

INITIATING AND MONITORING THE EVOLUTION OF SINGLE ELECTRONS WITHIN ATOM-DEFINED STRUCTURES

RELATED APPLICATIONS

This application claims priority benefit of U.S. Provisional Application Ser. No. 62/564,734; filed 28 Sep. 2017; the contents of which are hereby incorporated by reference.

FIELD OF THE INVENTION

The present invention in general relates to atomic structures, and in particular to the manipulation of individual electrons, the spontaneous rearrangements of electrons and the readout of electronic configurations in defined atomic structures.

BACKGROUND OF THE INVENTION

Neural Networks formed of interconnected information processing nodes are powerful machine-learning tools. Neural Networks turn vast amounts of unorganized data into useful information, and are increasingly used for a variety of important applications illustratively including: character recognition, speech recognition, automation translation, facial recognition or stock market prediction, to cite just a few examples.

Before a neural network can be put to work, the neural network must first be trained. One widely-used method of training involves comparing the results of data processed by the network to the original data, with the goal of having the network reproduce the input data. Over many iterations, the difference between the input and output data is quantified and used to algorithmically adjust and improve the network. A crucial step in this algorithmic adjustment requires computing the statistics of the network. This step is typically implemented using Markov Chain Monte Carlo (MCMC) software methods that are slow and computationally-expensive and do not guarantee the independence of the samples generated.

An example of an implementation of Markov Chain Monte Carlo analysis is the use of a Gibbs sampling or sampler. A Gibbs sampler is an algorithm for obtaining a sequence of observations which are approximated from a specified multivariate probability distribution, when direct sampling is difficult. This sequence of observations can be used to approximate the joint distribution (e.g., to generate a histogram of the distribution); to approximate the marginal distribution of one of the variables, or some subset of the variables (for example, the unknown parameters or latent variables); or to compute an integral (such as the expected value of one of the variables). Typically, some of the variables correspond to observations whose values are known, and hence do not need to be sampled.

Gibbs sampling is commonly used as a means of statistical inference, especially Bayesian inference. It is a randomized algorithm (i.e. an algorithm that makes use of random numbers), and is an alternative to deterministic algorithms for statistical inference such as the expectation-maximization algorithm (EM).

As with other MCMC algorithms, Gibbs sampling generates a Markov chain of samples, each of which is correlated with nearby samples. As a result, care must be taken if independent samples are desired. Generally, samples from the beginning of the chain (the burn-in period) may not accurately represent the desired distribution and are usually discarded. If necessary, one possible remedy is thinning the resulting chain of samples (i.e., only taking every nth value, e.g. every 10th value). It has been shown, however, that using a longer chain instead (e.g., a chain that is n times as long as the initially considered chain using a thinning factor of n) leads to better estimates of the true posterior. Thus, thinning should only be applied when time or computer memory are restricted.

In quantum mechanics, a Hamiltonian is an operator corresponding to the total energy of the system in most of cases. It is usually denoted by H, also Ĥ or Ĥ. The Hamiltonian spectrum is the set of possible outcomes when one measures the total energy of a system. Because the Hamiltonian spectrum has a close relation to the time-evolution of a system, it is of fundamental importance in most formulations of quantum theory.

Scanning probe microscopes are frequently employed to design novel atomic structures by positioning atoms at will. Scanning probe techniques are now used routinely to drive electronic, magnetic, and conformational changes to molecules and atoms on the surface. Perhaps of the greatest technological importance, probes can be used to assemble novel atomic structures. Since the pioneering work more than twenty-five years ago[1] many strategies have emerged to manipulate and pattern atoms and molecules on the surface. Recently approaches such as these have been used to experimentally realize electronic Hamiltonians[2,3], create atomically precise quantum dots[4], rewritable atomic memory[5], and nanoelectronic devices[6-8].

Many groups have demonstrated the ability to create, move, and controllably switch charged species on the surface with scanned probe techniques[9-13]. Recently Steurer et. al. demonstrated that charge can be laterally manipulated by controllably passing charge between pentacene molecules adsorbed on thin films of NaCl[14], opening the door to studying the dynamics of charge confined to surfaces. However, these studies have been conducted with the use of kelvin force probe microscopy (KPFM), which involves the application of large perturbative fields by the probe. This naturally impedes their use in the investigation of systems where charge states are loosely bound or in the absence of a probe.

Thus, there exists a need for improved methods for the manipulation and control of individual electrons in atomic structures. There also exists a need for improved neural network nodes with enhanced learning abilities.

SUMMARY

A method for the patterning and control of single electrons on a surface is provided that includes implementing scanning tunneling microscopy hydrogen lithography with a scanning probe microscope to form charge structures with one or more confined charges; performing a series of field-free atomic force microscopy measurements on the charge structures with different tip heights, where interaction between the tip and the confined charge are elucidated; and adjusting tip heights to controllably position charges within the structures to write a given charge state. The present disclose also provides a Gibb's distribution machine formed with the method for the patterning and control of single electrons on a surface. A multi bit true random number generator and neural network learning hardware formed with the above described method are also provided.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIGS. 4(a)-4(d) illustrate aspects of band bending theory

DETAILED DESCRIPTION OF THE INVENTION

The present invention has utility as a method for the patterning and control of single electrons on a surface. Embodiments of the invention may be used to create atomically precise structures with scanning tunneling microscopy hydrogen lithography using a scanning probe microscope that result in the design of novel charge structures. Furthermore, by performing a series of field-free atomic force microscopy measurements on these structures with different tip heights interaction between the tip and the confined charge are elucidated. It has been found that with small tip-sample separations, the tip may be used to controllably position charge within the structures to write a given charge state. By increasing the tip-sample separation the ability to non-perturbatively read the charge states of these structures in a digital fashion is made possible. By combining these two interaction regimes embodiments of the invention efficiently prepare given charge states of atomically defined systems, and follow their temporal evolution. Thus, embodiments of the invention provide the ability to position single electrons on the surface with a probe, and with this ability specific charge states of atomically engineered structures may be prepared and their field-free temporal evolution may be observed.

Embodiments of an inventive Gibb's distribution machine are provided based on the ability for patterning and control of individual electrons. Embodiments of the Gibb's distribution machine will take over the very time-consuming job, now handled arduously by Monte Carlo simulations, and allow restricted Boltzmann machines to be trained far more efficiently. It is to be understood that in instances where a range of values are provided that the range is intended to encompass not only the end point values of the range but also intermediate values of the range as explicitly being included within the range and varying by the last significant figure of the range. By way of example, a recited range of from 1 to 4 is intended to include 1-2, 1-3, 2-4, 3-4, and 1-4.

Experiments were performed on structures composed of silicon dangling bonds on the H—Si(100) surface. Recent efforts with this system have led to the ability to selectively re-hydrogenate dangling bonds, effectively enabling the creation of error-free designer structures[15,16]. In FIGS. 1(a)-1(d) two dangling bonds are patterned with two intervening H atom using STM lithography. In an AFM image of this structure, taken with zero applied bias between the tip and sample (FIG. 1b), the dangling bonds appear as dark indentations. A crucial observation of this simple structure is that in AFM images the dangling bonds appear streaky, indicating fluctuating charge states of the individual dangling bonds throughout the course of measurement.

Figure 1A:
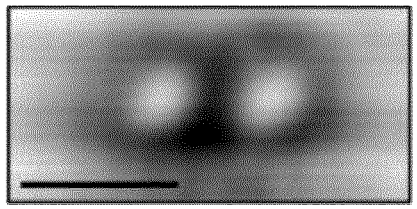
FIGS. 1(a)-1(d) illustrate fluctuating charge states of two tunnel-coupled dangling bonds, where (a) shows a constant current empty states STM image of the structure (scale bar is 2 nm), (b) shows s constant ΔfAFM image of the structure taken at 0 V. (c) shows two individual line scans made in constant height AFM mode along the red dotted line in (b) with an offset of −300 pm and at 0 V, and (d) shows Four hundred constant height AFM line scans taken sequentially over a five-minute period.
Figure 1B:
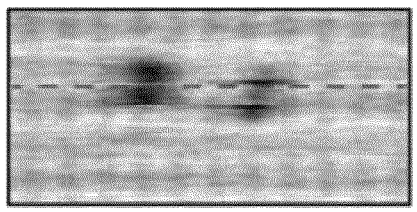
Figure 1C:
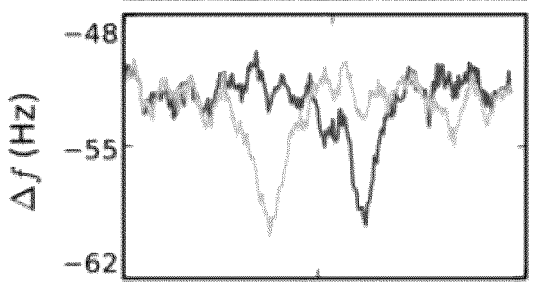
Figure 1D:
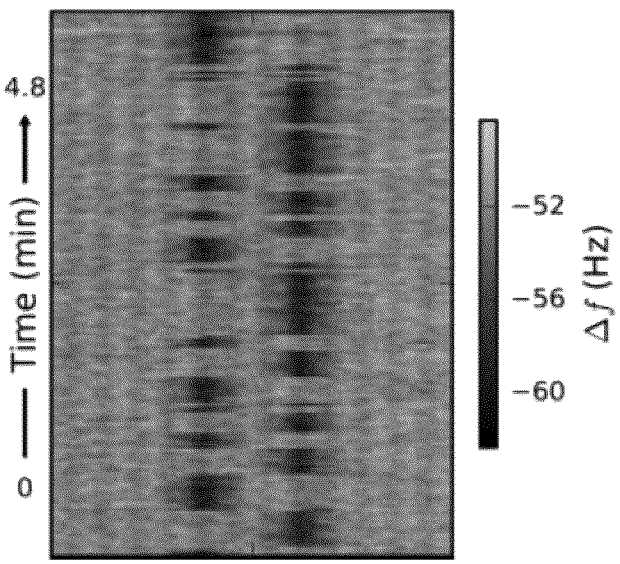

Previous studies of dangling bonds have indicated that in degenerately doped crystals, isolated dangling bonds are negatively charged. As two dangling bonds are brought closer together, however, Coulombic repulsion leads to ejection of one electron to the conduction band, and the pair of dangling bonds share a single negative charge. This can be seen experimentally from individual AFM line scans across the structure, which reveal that a single negative charge remains localized on one of the two dangling bonds throughout a measurement, but may spontaneously hop to the other dangling bond. FIG. 1(d) displays several hundred such line scans. As each line scan is taken sequentially, such images record the distribution of charge within the dangling bond structure over time.

Previous estimates for the tunneling rate between two dangling bonds at these close spacings have ranged from THz to GHz, depending on the spacing[17]. Surprisingly it was observed that such charge states often remain trapped for seconds. This provided a strong indication that the rate at which the charge states fluctuate is not governed by a tunneling process. As in the studies of charged atoms on salt it is believed that the charge remains trapped because the silicon lattice relaxes to accommodate it. This phenomenon is well known to occur on silicon, and stabilizes the system by ~100 meV.

Figures 2A, 2B, 2C, 2D:
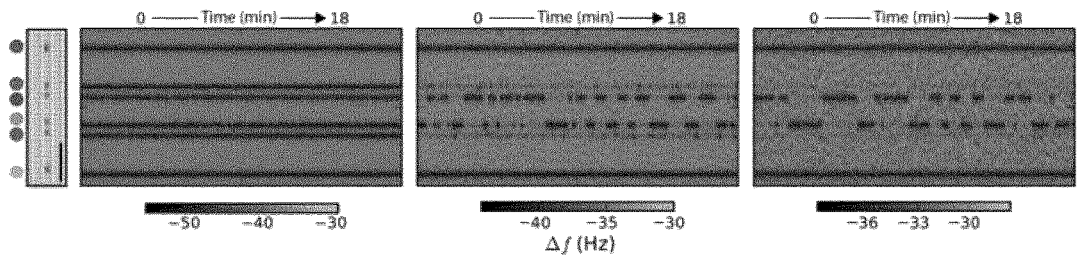
FIGS. 2(a)-2(f) illustrate the charge state evolution of a symmetric six dangling bond structure at different tip heights, where (a) shows a constant Δf image of the symmetric six dangling bond structure taken at 0 V, (b-d) show eight hundred constant height line scans at −320 pm (b), −290 pm, (c) and −270 pm (d) reveal the evolution of the system's charge states in time, (e,f) are histograms of the normalized Δf for each dangling bond evolved from single Gaussian distributions at −320 pm (e) contains a second Gaussian distribution at −270 pm (f) (legend next to (a)) shows that these Δf distributions can be unambiguously assigned to the negative and neutral charge states of each dangling bond, permitting a digital charge state to be inferred from each line scan.
Figure 2E:
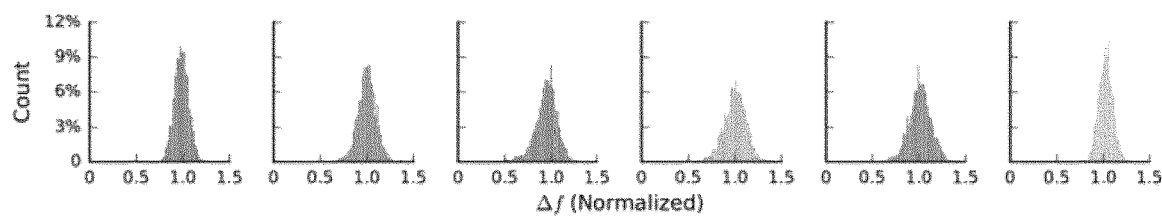
Figure 2F:
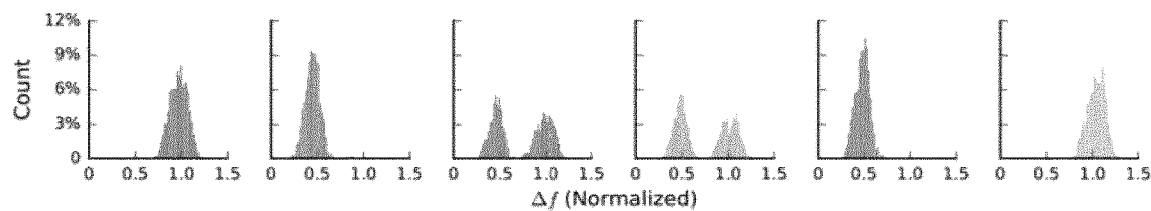

In order to confirm that these observations were not tip-dependent, a series of measurements were performed on the structure depicted in FIG. 2(a) and shown in FIGS. 2(b)-2(f), each at different tip heights. The scale bar in (a) is 3 nm. Tip heights are in reference to an STM constant current setpoint of −1.8 V and 50 pA measured over H—Si. Images contain sweeps in both directions across the sample. It was observed that at small tip-sample separations all the dangling bonds appeared to be harboring negative charge, but as the tip is retracted the apparent charge in the structure decreases. This is also evident in histograms composed of $\Delta f$ measured over each dangling bond, which evolve with tip height to contain two well-separated Gaussian profiles. These distinct $\Delta f$ can be clearly assigned to the negative and neutral charge states of each dangling bond.

Not to be limited to a particular theory, there are several possible explanations for why the net charge of the structure appears to be different at different tip heights. First, it is possible that with small-tip sample separations electrons tunnel from the tip to populate each of the dangling bonds, thus increasing the net charge of the structure. Crucially though, all the scans were performed at 0 V, and while there remains a contact potential difference between the tip and sample it would be effectively screened by the addition of only a few charges. A second possibility is that the net charge of the structure remains constant regardless of tip-sample separation but the tip can stabilize charge in the dangling bond directly beneath it. Thus, as the tip scans across the structure, a negative charge will always appear in the dangling bond directly beneath it. This seems counter-intuitive given that the contact potential difference between the silicon sample and tungsten probe would predict upward band bending, which would destabilize negative charge beneath the tip. Fortunately, when image charge induced in the tip is accounted for, it was found that at close tip sample separations the overall field directly beneath the tip causes downward band bending (SI in FIG. 1), thereby stabilizing negative charge. Discussion of the image charge is often neglected in AFM experiments. This is likely because image charge contribution to the overall force exerted on the tip is generally small, however, it was found that the field it contributes cannot be neglected in experiments at 0 V. This suggests that with small tip-sample separations the tip effectively creates a shallow potential well that can be used to drag a single electron through the atomic structure.

Because the $\Delta f$ of the negative and neutral charge states of each dangling bond can be clearly resolved, the charge configuration of the structure can be assigned a digital state with each line scan. This digitization has been achieved with error rates of <1% (SI in FIG. 2), but is often several percent, as will be discussed further below. At the greatest tip sample separation (~270 pm) a single negative charge is shared between the four interior dangling bonds, and the two lone dangling bonds on either end each harbor a negative charge (FIG. 2d). The interior charge fluctuates between the two pairs of dangling bonds, and always resides upon the inner dangling bond of each pair. This result is consistent with a naïve electrostatic approximation which would minimize the energy of the system by maximizing the distances between negative charges. Because the structure is symmetric this would also predict that in the absence of any local perturbations these two states would degenerate in energy. This can be clearly confirmed by observing that the total amount of time the system spends in the left state (50%) is roughly equal to the right state (46%) over the full thirty-six-minute measurement.

Furthermore, it is crucial to note that at large tip-sample separations the charge state of the system appears to remain unchanged for many measurements (>15 s on average for both states) regardless of which direction the tip scans over the structure. This clearly suggests that at this distance any influence the tip exerts on the charge state of the structure is weak. From this it is concluded that there are two interaction regimes: a strongly interacting regime with small tip-sample separations, where the charge is dragged by the tip (the write regime), and a weakly interacting regime where we can observe the natural charge state fluctuations of the structure (the read regime).

Figure 3A:
FIGS. 3(a)-3(j) illustrate the controlled preparation of charge states in symmetric and asymmetric dangling bond structures, where (a) shows a constant Δf image of the symmetric six dangling bond structure taken at 0 V, (b) illustrates natural charge state fluctuations of the symmetric structure observed in the read regime (−270 pm), (c) shows read phase line scans corresponding to a write phase (−320 pm, not pictured) where the tip scanned from left to right across the structure, (d) illustrates the experiment complimentary to (c) where the directions of both line scans are reversed, (e) illustrates a comparison of the digital charge states of the structure in experiments (b-d) where the digital states correspond to assigning a zero to neutral dangling bonds, a one to negative dangling bonds, and constructing a binary number from the paired dangling bonds, (f) shows a constant Δf image of the asymmetric five dangling bond structure taken at 0 V. (g-j) illustrate Write-Read experiments performed on the asymmetric structure (not sure what to say about these highlights just drop for now?write regime: ??? pm, read regime: ?? pm) where the digital states in (j) are assigned identically as in (e) (The scale bars in (A) and (F) are 3 nm. Tip heights are in reference to an STM constant current setpoint of −1.8 V and 50 pA measured over H—Si)
Figure 3F:
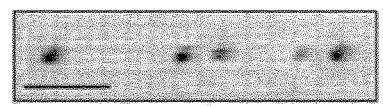
Figure 3B:
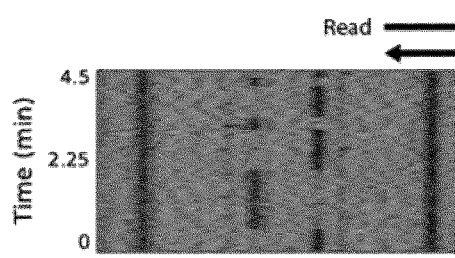
Figure 3G:
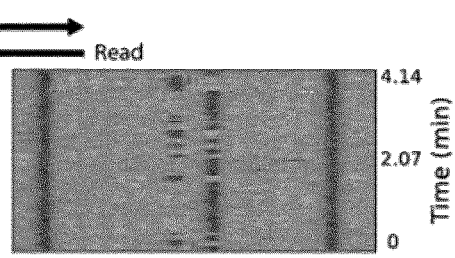
Figure 3C:
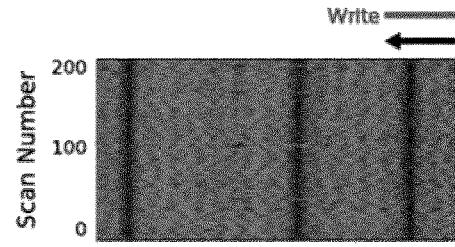
Figure 3H:
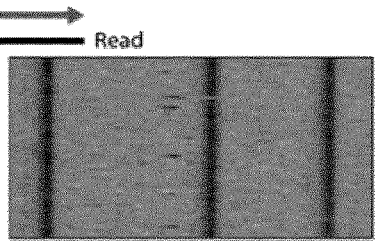
Figure 3D:
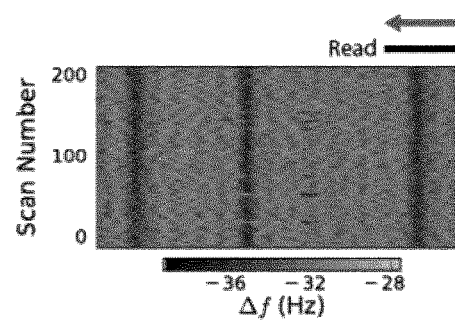
Figure 3I:
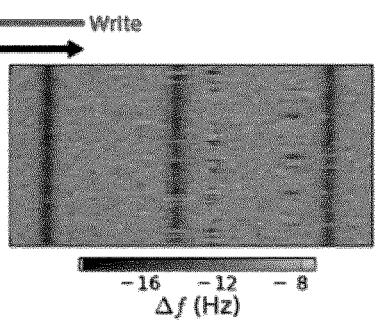
Figure 3E:
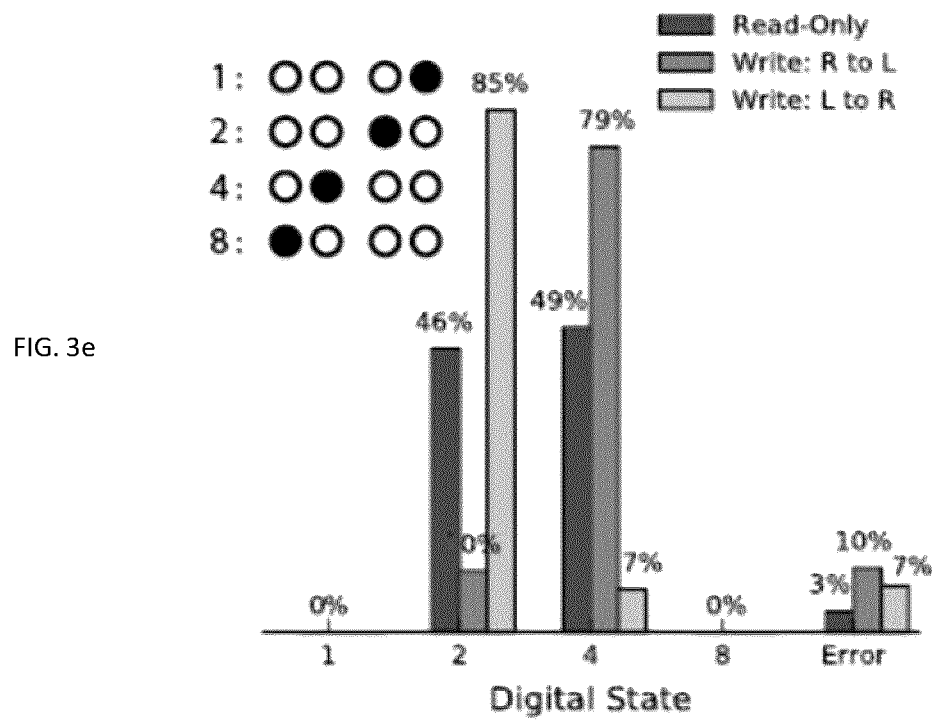

In order to further validate this, experiments were performed as depicted in FIGS. 3(c)-3(e). Each measurement has two associated phases. In the write phase, the tip is scanned across the structure with a small tip-sample separation (write regime). In the read phase, the tip is retracted 50 pm (read regime) and scanned back across the structure (FIGS. 3(c)-3(e)). If during the read phase the tip is non-perturbative, then any charge state prepared by the write phase should be observed. Indeed, this is the case. When performing a write scan from left to right it was consistently (85%) observed that the ground state with the charge in the right-hand pair of dangling bonds. Likewise, performing a write scan from right to left prepares the other ground state with 79% efficiency. This indicates that both ground states of the structure can be efficiently prepared with AFM.

Figure 3J:
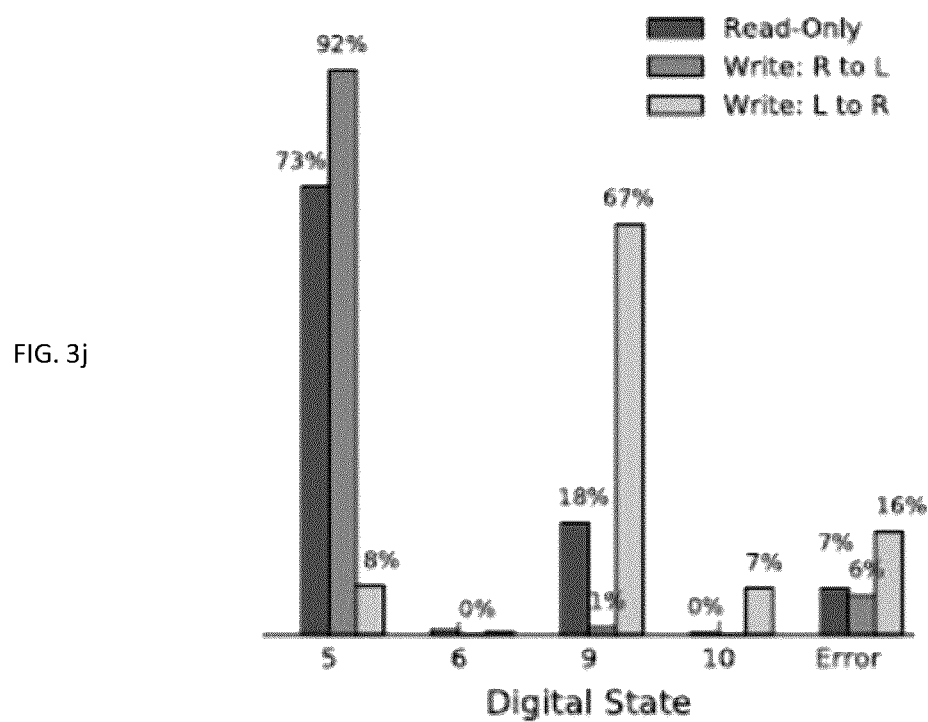
Figures 4A, 4B:
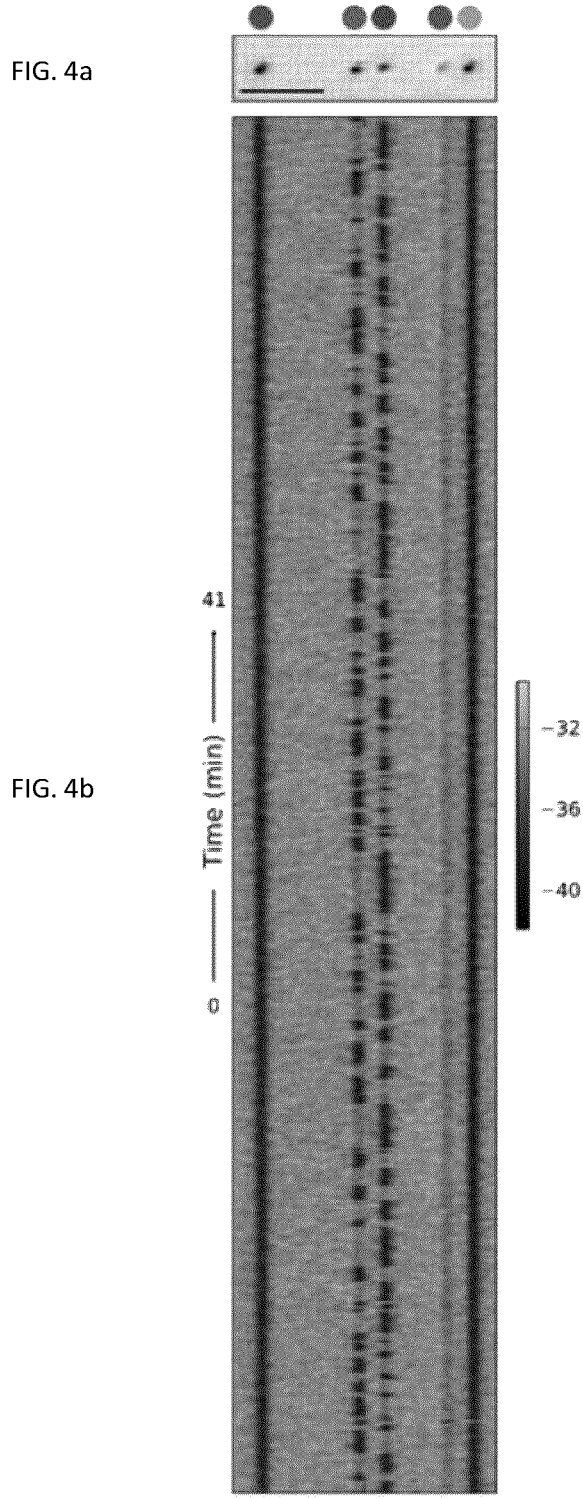
Figure 5A:
FIGS. 5(a)-5(d) illustrate electron spacing Δf with scale bars that are 3 and 4 nm, respectively.
Figure 5B:
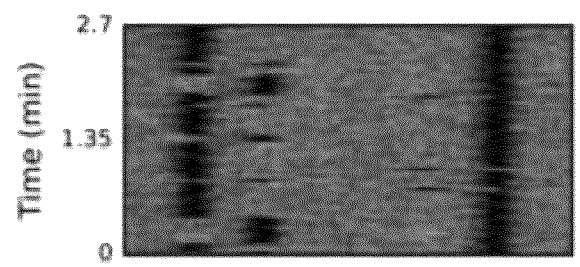
Figure 5C:
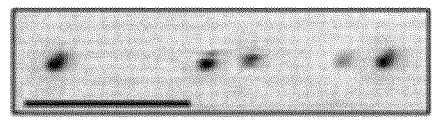
Figure 5D:
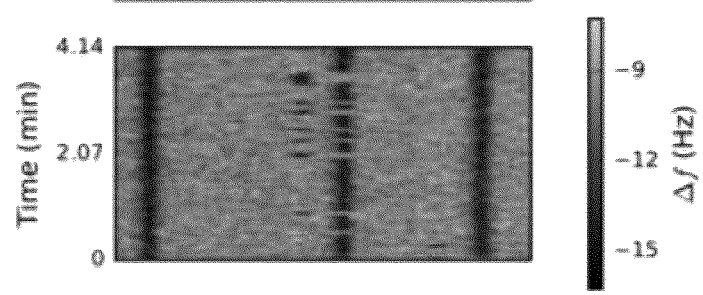

Atomic force microscope (AFM) measurements on structures that were investigated previously have indicated that the structures may occasionally access excited states of the system. To investigate if these techniques may be used to prepare excited charge states these experiments were performed on a non-symmetric structure (FIG. 3(f)-3(j), where it is noted that these experiments were performed with a different tip, and therefore the write and read heights differ from the symmetric structure). The inclusion of only one isolated dangling bond removes the symmetry which previously permitted a degenerate ground state and reduces local band bending due to negatively charged dangling bonds. Measurements restricted to the read regime (FIG. 3(g)) demonstrate that this system fluctuates between two charge states corresponding to negative charges occupying both pairs of dangling bonds. The ground state of this structure can be inferred from a histogram of the system's digital states (FIG. 3(j)), and in this case, it is not what would be predicted electrostatically. Even though the structure was patterned in an area without any immediate defects this suggests that other charges (e.g., other dangling bonds or ionized donors) near the structure act as an additional electrostatic bias, although the local bias may be changed on the pair by patterning new charged dangling bonds (SI in FIG. 3). Importantly, high-energy states corresponding to localizing two negative charges on a single pair of dangling bonds, or on the dangling bonds that are adjacent in each pair, remain inaccessible.

Write and read experiments performed on this structure reveal important insights into the limits of these techniques to laterally manipulate charge. When writing from left to right (FIG. 3(h)) is observed that the negative charge favors the right-hand dangling bond in each pair, which is consistent with the previous experiments. This corresponds to preparation of the ground state, and can therefore be done with high efficiency (92%). When writing from right to left, however, the charge in the right-hand pair typically remains in the right-hand dangling bond, although the left-hand charge can be efficiently manipulated (FIG. 3(i)). This suggests that when states are strongly disfavored electrostatically they cannot be prepared with high efficiency with AFM, or their lifetime is shorter than the time resolution of these techniques (~1 s). Results on other structures that were prepared indicate that states can only be efficiently prepared if they exist naturally (i.e., the states are observed in read-only experiments), and that lower energy states can be prepared more efficiently than higher energy states.

Several factors that contribute to the error rate in these experiments have been identified. Firstly, the measurements are extremely sensitive to tip height. Even though it was found that charge states can remain stable for many sequential measurements in the read regime, clearly the influence of the tip on these structures cannot be entirely discounted. Accordingly, it was found that even small changes in tip height can introduce errors to the measurement, corresponding to line scans where adjacent dangling bonds both appear to harbor negative charge. Given the slow rate of measurement (approximately 1 s per line scan) it is also expected that charge occasionally tunnels between dangling bonds during a measurement, even without influence of the tip. Finally, it is noted that the sensitivity of the technique is highly tip dependent. Sharp tips more clearly resolve the two charge states of each dangling bond, and therefore reduce errors associated digitization. Also, H-terminated tips, which can be effectively identified via kelvin probe force microscopy measurements[16], appear to interact more strongly with neutral dangling bonds than silicon or tungsten tips, and therefore reduce sensitivity.

These results were extremely surprising given that they demonstrate charge states in atomic structures can remained trapped for periods on the order of seconds. In addition, many of our results can be interpreted via simple electrostatic arguments. This suggests such atomic systems could serve well as the building blocks for field controlled computing architectures or other similar devices. Crucially, these results help elucidate the influence of the tip in field-free AFM experiments and suggest that while such measurements can be made largely non-perturbatively, extremely small changes in tip height (~50 pm) can completely change the regime of interaction. Thus, embodiments of the invention utilize scanning probes to position charge within atomic structures and prepare desired charge states with a high fidelity.

The aforementioned inventive ability charge within atomic structures and prepare desired charge states with a high fidelity may be utilized to fulfill the need for improved neural network learning hardware that is faster and more accurate.

Inventive embodiments of a fast and accurate (producing unbiased samples) all-silicon, atom-scale Gibbs Sampler, which may replace Markov Chain Monte Carlo software, have been demonstrated that remove an important bottleneck in training a widely-used type of neural network machine.

With respect to Gibbs sampling in principle, for any entity an equation may be derived in the form of a Hamiltonian that describes the quantized states that the entity can exhibit. Each state has an associated energy. If the entity were to remain completely isolated, it would exist in its lowest energy state the ground state. But, upon interacting with an environment of finite temperature, the entity will transiently exist in states with higher energy excited states. Access to higher energy states occurs with a probability that is exponentially related to the energy difference between the ground and excited state. So, fluctuations will occur, most frequently to the lowest excited states and rarely to higher ones. A readout of those thermal fluctuations of state is a Gibbs sample.

With the understanding and control of atomic scale properties of silicon as described above and using hydrogen lithography technology an inventive device that is an embodiment of a Hamiltonian that fully defines the problem to be solved may be made. Physically embodying a Hamiltonian in silicon makes it possible to generate accurate data that is otherwise only approximated by arduous and costly computational methods. Furthermore, the use of silicon makes the implementation compatible with other established circuitry.

In a specific embodiment, a Gibbs sampler may be thought of as a physical embodiment of a spin-type Hamiltonian given by:

$$H = -\sum_i b_i v_i - \sum_{j<i} J_{ij} v_i v_j$$

where such a Hamiltonian has a term that biases the alignment of individual spins ($b_i$) and one that couples spins ($J_{ij}$). In inventive embodiments, the spatial distribution of charge is used rather than spin and $b_i$ terms are implemented via local electronic fields. This Hamiltonian can be used to describe restricted Boltzmann machines and other similar machine-learning networks. In software implementations of such networks, $b_i$ and $J_{ij}$ are optimized during an iterative training process that requires thermally distributed samples of the Hamiltonian to update $b_i$ and $J_{ij}$. These samples can be generated accurately, quickly and efficiently with embodiments of the inventive hardware implementation. Our results show that a multi-qubit device has repeated readouts that yield samples consistent with thermal fluctuations about the ground state that is exactly as desired.

It is further noted that the readout process is using a unique lattice deformation caused by single electron localization on one atomic silicon quantum dot within the qubit. That "electron phonon coupling" action allows a classical state to be created and latched, thereby enabling secure and stable readout by circuitry such as a single electron transistor. The process of transitioning from a superimposed quantum state to a classical state, is often called wavefunction collapse.

Embodiments of device may be configured to collapse spontaneously and randomly. A collapse may be triggered with an electrical stimulus or other stimulus. This attribute is very useful in all manner of quantum electronics.

In specific inventive embodiments results are gathered by examining successive states of the machine using Atomic Force Microscopy at low temperatures. However, inventive embodiments utilizing single atom, single electron transistor readout devices may be run at higher temperatures, and are capable of generating independent samples at a rate on the order of $10^5$ samples per second.

It is appreciated that while the inventive embodiment described is useful in training of neural network devices, and the restricted Boltzmann machine is just one type of neural network. Furthermore, embodiments of the invention may be used to make a multi bit true random number generator, as well as enabling all manner of control and input/output (IO) functions. In a specific embodiment, multiple inventive devices can form an ensemble that will have a larger energy barrier enforcing the latching action. This enables a new kind of atom scale, ultra-low power consuming digital memory.

EXAMPLES

Example 1

Experimental Setup—Experiments were performed using an Omicron LT STM/AFM head operating at 4.5 K and ultrahigh vacuum (<1×10$^{-10}$ Torr). Tips were created from polycrystalline tungsten wire that was chemically etched, then sharpened, cut, and welded to a qPlus sensor using a focused ion beam. This fabrication technique reduces the sensors' mass loading to improve its quality factor. An additional electrode on the sensor was used to supply tunneling current. Tips were further processed with electron bombardment to remove the surface oxide, and sharpened by nitrogen etching while performing field ion microscopy. In-situ tip processing was performed by making controlled contacts with the tip to the sample surface, where previous reports have indicated likely results in a silicon apex. Samples were cleaved from (100)-oriented Si crystals that are highly As-doped (1.5×10$^9$ atom cm$^{-3}$). After degassing at 600° C. for 12 hours, samples were flash annealed to temperatures as high as 1250° C. before passivating the surface with hydrogen while maintaining a sample temperature of 330° C. These high flash temperatures have been previously shown to induce a dopant depletion region extending as far as 100 nm below the surface.

Description of data processing—Minimal data processing was performed, and raw data was used whenever possible. All experiments with repeated line scans were performed in constant height mode. For experiments performed entirely in the read regime, forward and backward line scans, were saved in separate files by the control software, and were aligned manually by removing an equal number of pixels from both scans and zipped together (step 1). Measurements often exceeded 30 minutes, over which time the tip would inevitably drift towards or away from the surface. To account for this, a linear drift was subtracted from all measurements with repeated line scans by fitting the average Δf for each line scan over the course of an experiment (step 2). Experiments where Δf drifted by more than 2 Hz were rejected. The Δf measured over each dangling bond were extracted by independently fitting each window they occupied in the line scans (defined by pixels) with a Gaussian function (step 3). When dangling bonds were neutral, this corresponded to fitting the Δf associated with the background/hydrogen, and therefore the peak of each Gaussian was constrained to a 30-pixel window centered on each dangling bond. Two additional steps were used to create the histograms in FIG. 2(d)-2(e). First, the largest Δf in the set of the Δf extracted for all the dangling bonds in an experiment (corresponding to a fit of the background) was set to 0 (step 4). Thus, the normalized Δf for all the dangling bonds would be positive. Second, each Δf was normalized by setting the average Δf for the two isolated dangling bonds to 1.0 (step 5). Because the isolated dangling bonds were always negatively charged, a normalized Δf of 1.0 corresponds to the average Δf for a negatively charged dangling bond. To digitize each line scan, a single common cut in Δf was used for each dangling bond (step 6). Typically, this was performed on the normalized data, although it works equally well with the data from step 2 in structures where none of the dangling bonds are consistently negatively charged.

Figure 6:
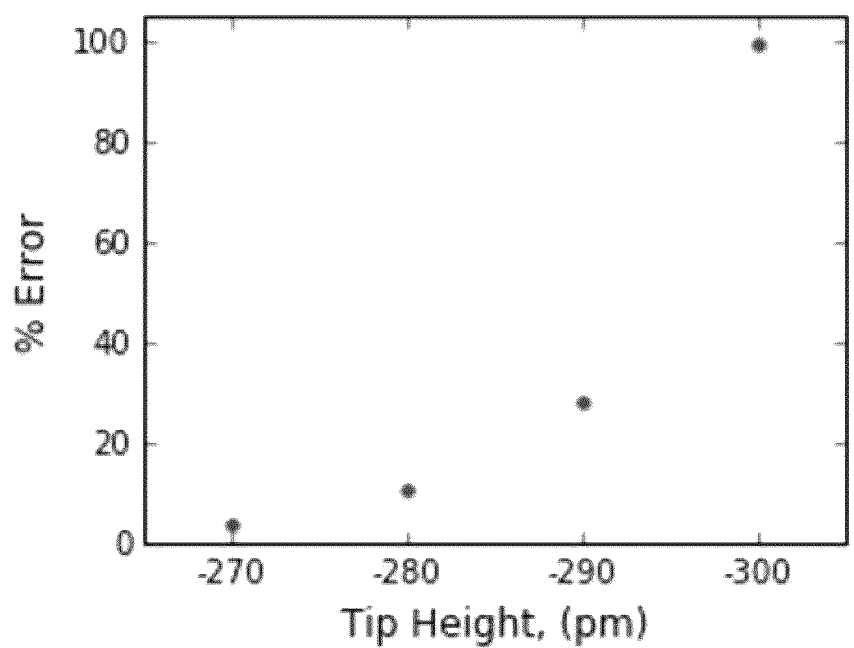
FIG. 6 is a graph of probe tip height versus error percentage.

FIGS. 4(a)-4(d) illustrate aspects of band bending theory with two silicon atoms FIGS. 5(a)-5(d) illustrate electron spacing Δf with scale bars that are 3 and 4 nm, respectively with three silicon atoms; and FIG. 6 is a graph of probe tip height versus error percentage for four silicon atoms.

The coupling of a situs of electronic charge wiring as shown requires a degree of control coupling and wiring. The details of which are detailed in pending application PCT/IB2017/001051 filed 19 Jul. 2017. Specific techniques of coupling and the formation of the molecular scale analog to wires detailed therein includes the use of controlled placement of atomic silicon molecules (ASiMs). In attributes of ASiMs that allow them to serve as electronic components in classical binary or analog circuitry or as coherent electron elements with quantum circuitry include: an electric field induced altered electronic structure is used in some inventive embodiments to convey an action at a distance; a perturbation, or a signal input at one end or region of an ASiM can be registered elsewhere on the ASiM; a receptor or detector of that alteration can effectively complete a transmission of information; and multiple inputs along a ASiM can diversely and programmatically alter the electronic structure so as to achieve a computation which can be registered by receptors at one or more other points on the ASiM. Collections of ASiMs, or equivalently, molecules with gap spacing, can exhibit profound shifts in electronic structure in response to perturbations: such molecules can exhibit 2 state binary behavior, or, continuously variable electronic behavior with a very large polarization range; in a binary application, a linear wire like molecule, or a more complex shape composed of many such contiguous line segments, will exhibit two longitudinally shifted electronic states, and those can be used to represent, store and transmit binary information; and in a quantum electronic application, the same structure types as above can couple distant qubits, with either sign of coupling, in a way known as J coupling. Typically, J coupling refers to coupling between two spins, such as in an Ising model. Such J coupling is analogous to capacitive coupling in an electric circuit and is often referred to as ZZ coupling in the quantum computing literature. Variants on ASiM based couplers also allow inductive-like coupling known as XX coupling. Other variants too can be made. Access to diverse types, strengths and sign of coupling allows for more diverse, more nearly universal quantum computing.

Fabricating ASiMs where and as needed represents a practical expression of what has been termed molecular electronics. Unlike previous attempts, where molecular chemistry is laborious and mostly unsuccessfully guided into a desired position, the present invention achieves positioning and interfacing to wire contacts and other components by making the wire and other components where and as needed.

ASiMs have new collective states that are also in the bulk silicon band gap. The splitting associated with bonding therebetween is of the order 0.1 eV, thereby limiting the molecular states to the gap region as well.

Crucially, the collective states of the ASiMs therefore do not effectively mix with silicon bulk electronic states, allowing for atom sized wires and other electric classical and quantum elements to be formed on the silicon surface and be largely electrical insulated and decoupled from the bulk without the need for an intervening insulator.

The elimination of the need for an insulator enormously reduces the dimensions of a conductor that can be routed over a silicon surface, while also allowing the atom size conductor to be perfectly ordered with respect to the underlying silicon lattice.

The perfect order and small overall size of such wires and other elements allows or identical structures to be fabricated. Identical structures have homogenous properties. Circuits and devices composed of elements with homogeneous properties have themselves far more predictable properties than devices and circuits made of elements with a range of properties.

In making atom scale circuitry on a silicon substrate, it becomes necessary and desirable to provide ultrafine, even atom scale wiring to the active entities of the circuitry. The need for an insulator between such a wire and the silicon substrate enormously complicates, enlarges, and brings spatial and compositional uncertainty to the wires and their exact relation to the address active entities. In the present invention, there is no need for an insulating layer, and the ability to make wires with reproducibly precisely, atomically defined character greatly enables and advances the act of making atomic level circuitry. Specifically, having known and unvarying relationships between electrical leads and the entities they address leads to near zero inhomogeneity in circuit properties.

Static electrostatic inputs in the form of singly charged atoms are shown here to demonstrate function of the wires and gates. Analog wires which can be biased at any voltage within a range of several 10s of volts about the Fermi level and with a resolution of nanovolts or finer can also serve as inputs to the wires and gates.

An attribute of these AsiMs as atomic scale couplers is that the polarizability can be varied through the electron occupation of the coupler by various techniques that include a gating action that adjusts the local Fermi level and thereby changes the occupation of the coupler, as well as polarity change of couplers. Polarity change of coupler is accomplished by reversing gate voltage or by selecting one of several couplers placed between bits to affect coupling polarity change.

The aforementioned explanation and results have demonstrated that the selective placement or "writing" of charges can be stabilized by a lattice relaxation effect. According to the present invention, this attributue is technically exploited to self-localize an electron in a structure that would otherwise not trap and localize the electron. As a result, structures are positioned, or controls are applied proximal to, or to applied directly to a qubit or bit to controllably render the qubit or bit trapping, or alternatively, not trapping.

The ability to induce trapping is often technically quite useful as it means that an electron in a superposition of "left and right" states can be collapsed to a classical state of just one or the other of "left" or "right" so as to facilitate electrical read out to a user, or other element of a more complex device. This is contrast to a simple pair of Si atoms that has attributes that better fit the theory of a classical bit in which always pure left or pure right states are present.

Any patents or publications mentioned in this specification are herein incorporated by reference to the same extent as if each individual publication was specifically and individually indicated to be incorporated by reference.

The foregoing description is illustrative of particular embodiments of the invention, but is not meant to be a limitation upon the practice thereof. While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the described embodiments in any way. Rather, the foregoing detailed description will provide those skilled in the art with a convenient road map for implementing the exemplary embodiment or exemplary embodiments. It should be understood that various changes can be made in the function and arrangement of elements without departing from the scope as set forth in the appended claims and the legal equivalents thereof.

REFERENCES

1. Schweizer, D. K. & Eigler, E. K. Positioning single atoms with a scanning tunneling microscop. *Nature* 344, 524-525 (1990).
2. Drost, R., Ojanen, T., Harju, A. & Liljeroth, P. Topological states in engineered atomic lattices. 13, (2016).
3. Slot, M. R. et al. Experimental realization and characterization of an electronic Lieb lattice. 13, (2016).
4. Crommie, M. F., Lutz, C. P. & Eigler, D. M. Confinement of Electrons to Quantum Corrals on a Metal Surface. *Science* (80-.). 262, 218-220 (1993).
5. Kalff, F. E. et al. A kilobyte rewritable atomic memory. *Nat. Nanotechnol.* 18, 1-5 (2016).
6. Fuechsle, M. et al. A single-atom transistor. *Nat. Nanotechnol.* 7, 242-246 (2012).
7. Kolmer, M. et al. Realization of a quantum Hamiltonian Boolean logic gate on the Si(001):H surface. *Nanoscale* 7, 12325-12330 (2015).
8. Huff, T. et al. Binary Atomic Silicon Logic. (2017).
9. Setvin, M., Hulva, J., Parkinson, G. S., Schmid, M. & Diebold, U. Electron transfer between anatase TiO 2 and an O 2 molecule directly observed by atomic force microscopy. *Proc. Natl. Acad. Sci.* 201618723 (2017). doi:10.1073/pnas.1618723114
10. Steurer, W. et al. Manipulation of the charge state of single au atoms on insulating multilayer films. *Phys. Rev. Lett.* 114, 1-5 (2015).
11. Walch, H. et al. Electromechanical switching behavior of individual molecular complexes of Cu and Ni on NaCl-covered Cu(111) and Ag(111). *Phys. Rev. B-Condens. Matter Mater. Phys.* 86, 1-7 (2012).
12. Leoni, T. et al. Controlling the charge state of a single redox molecular switch. *Phys. Rev. Lett.* 106, 4-7 (2011).
13. Gross, L. et al. Measuring the Charge State of an Adatom with Noncontact Atomic Force Microscopy. *Science* (80-.). 324, 1428-1431 (2009).
14. Steurer, W., Fatayer, S., Gross, L. & Meyer, G. Probe-based measurement of lateral single-electron transfer between individual molecules. *Nat. Commun.* 6, 8353 (2015).
15. Pavliček, N., Majzik, Z., Meyer, G. & Gross, L. Passivation of dangling bonds on hydrogenated Si(100)-2$\times$1: a possible method for error correction in hydrogen lithography. *Appl. Phys. Lett.* 111, 53104 (2017).
16. Huff, T. R. et al. Atomic White-Out: Enabling Atomic Circuitry through Mechanically Induced Bonding of Single Hydrogen Atoms to a Silicon Surface. *ACS Nano* acsnano.7b04238 (2017). doi: 10.1021/acsnano.7b04238
17. Livadaru, L. et al. Dangling-bond charge qubit on a silicon surface. *New J. Phys.* 12, 83018 (2010).

The invention claimed is:
1. A method for the patterning and control of single electrons on a surface comprising:

implementing scanning tunneling microscopy hydrogen lithography with a scanning probe microscope to form charge structures with one or more confined charges;

performing a series of field-free atomic force microscopy measurements on the charge structures with different tip heights, where interaction between the tip and the confined charge are elucidated; and adjusting tip heights to controllably position charges within the structures to write a given charge state.

2. The method of claim 1 further comprising degassing the surface at 600° C. for twelve hours.

3. The method of claim 1 further comprising flash annealing the surface to a temperature of 1250° C.

4. The method of claim 1 further comprising maintaining the surface at a temperature of 330° C. while passivating the surface with hydrogen.

5. The method of claim 1 further comprising digitally reading the charge state of the structure by scanning the surface with the tip separated from the surface.

6. The method of claim 1 further comprising observing a field-free temporal evolution of the charged structure.

7. The method of claim 1 wherein in the write regime, the tip creates a shallow potential well.

8. The method of claim 7 wherein the shallow potential well is used to drag a single electron through the atomic structure of the surface.

9. The method of claim 1 wherein the atomic force microscopy is performed in a read regime wherein the tip is separated from the surface such that the charge state is not influenced by the tip.

10. The method of claim 9 wherein in the read regime, the tip is separated from the surface by at least 50 pm and a maximum separation of 270 pm.

11. The method of claim 1 wherein the surface is an H—SI(100) surface.

12. The method of claim 1 wherein the tip is a tungsten tip or a silicon tip.

13. The method of claim 1 wherein the tip is an H-terminated tip.

14. The method of claim 1 wherein a scanning tunneling microscopy and atomic force microscopy head is operated at 4.5 K.

15. The method of claim 1 wherein a scanning tunneling microscopy and atomic force microscopy head is operated under a vacuum of less than $1\times10^{-10}$ Torr.

16. A Gibb's distribution machine formed with the method of claim 1.

17. The machine of claim 16 wherein the machine is configured to collapse spontaneously.

18. The machine of claim 17 wherein the collapse is triggered by an electrical stimulus.

19. The machine of claim 16 wherein the machine is configured to train neural network devices.

20. A multi bit true random number generator formed with the method of claim 1.

* * * * *